United States Patent
Boughton

(10) Patent No.: US 9,908,804 B2
(45) Date of Patent: Mar. 6, 2018

(54) METHODS AND APPARATUS FOR MATERIAL PROCESSING USING ATMOSPHERIC THERMAL PLASMA REACTOR

(71) Applicant: Corning Incorporated, Corning, NY (US)

(72) Inventor: Daniel Robert Boughton, Rushville, NY (US)

(73) Assignee: Corning Incorporated, Corning, NY (US)

( * ) Notice: Subject to any disclaimer, the term of this patent is extended or adjusted under 35 U.S.C. 154(b) by 0 days.

(21) Appl. No.: 15/235,715

(22) Filed: Aug. 12, 2016

(65) Prior Publication Data

US 2016/0347641 A1    Dec. 1, 2016

Related U.S. Application Data

(62) Division of application No. 14/230,914, filed on Mar. 31, 2014, now Pat. No. 9,533,909.

(51) Int. Cl.
  *C03B 19/10* (2006.01)
  *H01J 37/32* (2006.01)
  (Continued)

(52) U.S. Cl.
  CPC ........ *C03B 19/109* (2013.01); *C03B 19/1005* (2013.01); *C03B 19/1015* (2013.01); *H01J 37/32082* (2013.01); *H01J 37/32614* (2013.01); *H01J 37/32825* (2013.01); *H05H 1/30* (2013.01); *H05H 1/42* (2013.01)

(58) Field of Classification Search
  CPC .. C03B 5/25; C03B 5/185; C03B 3/02; C03B 19/1005; C03B 19/109; C03B 19/1015; H05H 1/30

See application file for complete search history.

(56) References Cited

U.S. PATENT DOCUMENTS 1,476,432 A    12/1923    Troutman et al.
3,937,625 A    2/1976    Stewart
(Continued)

FOREIGN PATENT DOCUMENTS

CN    10248248 C    12/2003
CN    10176202 A    7/2010
(Continued)

OTHER PUBLICATIONS

CN101767202A Machine Translation, Performed by Google Nov. 20, 2015.*

(Continued)

*Primary Examiner* — Lisa L Herring

(57) ABSTRACT

Methods and apparatus provide for: producing a plasma plume within a plasma containment vessel from a source of plasma gas; feeding an elongate feedstock material having a longitudinal axis into the plasma containment vessel such that at least a distal end of the feedstock material is heated within the plasma plume; and spinning the feedstock material about the longitudinal axis as the distal end of the feedstock material advances into the plasma plume, where the feedstock material is a mixture of compounds that have been mixed, formed into the elongate shape, and at least partially sintered.

18 Claims, 3 Drawing Sheets

(51) Int. Cl.
*H05H 1/30* (2006.01)
*H05H 1/42* (2006.01)

(56) References Cited

U.S. PATENT DOCUMENTS

| | | | |
|---|---|---|---|
| 4,082,694 A | 4/1978 | Wennerberg et al. | |
| 4,315,720 A * | 2/1982 | Ueda | B01J 2/04 264/8 |
| 4,318,712 A | 3/1982 | Lang et al. | |
| 4,440,556 A * | 4/1984 | Oh | C03B 37/02718 65/391 |
| 5,081,397 A | 1/1992 | Liang et al. | |
| 5,147,448 A * | 9/1992 | Roberts | B22F 1/0088 264/12 |
| 5,238,888 A | 8/1993 | Abe | |
| 5,403,453 A | 4/1995 | Roth et al. | |
| 5,414,324 A | 5/1995 | Roth et al. | |
| 5,421,891 A | 6/1995 | Campbell et al. | |
| 5,456,972 A | 10/1995 | Roth et al. | |
| 5,527,518 A | 6/1996 | Lynum et al. | |
| 5,669,583 A | 9/1997 | Roth | |
| 5,711,664 A | 1/1998 | Jegou et al. | |
| 5,734,143 A | 3/1998 | Kawase et al. | |
| 5,750,822 A | 5/1998 | Gotovchikov et al. | |
| 5,938,854 A | 8/1999 | Roth | |
| 6,042,370 A | 3/2000 | Weide | |
| 6,053,013 A | 4/2000 | Oh et al. | |
| 6,348,123 B1 | 2/2002 | Nakata et al. | |
| 6,351,075 B1 | 2/2002 | Barankova et al. | |
| 6,410,449 B1 | 6/2002 | Hanawa et al. | |
| 6,417,625 B1 | 7/2002 | Brooks et al. | |
| 6,428,600 B1 | 8/2002 | Flurschutz et al. | |
| 6,453,842 B1 | 9/2002 | Hanawa et al. | |
| 6,468,388 B1 | 10/2002 | Hanawa et al. | |
| 6,494,986 B1 | 12/2002 | Hanawa et al. | |
| 6,551,446 B1 | 4/2003 | Hanawa et al. | |
| 6,893,907 B2 | 5/2005 | Maydan et al. | |
| 6,919,527 B2 | 7/2005 | Boulos et al. | |
| 6,939,434 B2 | 9/2005 | Collins et al. | |
| 7,037,813 B2 | 5/2006 | Collins et al. | |
| 7,094,316 B1 | 8/2006 | Hanawa et al. | |
| 7,094,670 B2 | 8/2006 | Collins et al. | |
| 7,137,354 B2 | 11/2006 | Collins et al. | |
| 7,166,524 B2 | 1/2007 | Al-Bayati et al. | |
| 7,183,177 B2 | 3/2007 | Kelly et al. | |
| 7,223,676 B2 | 5/2007 | Hanawa et al. | |
| 7,264,688 B1 | 9/2007 | Shokrollahi et al. | |
| 7,288,491 B2 | 10/2007 | Collins et al. | |
| 7,291,545 B2 | 11/2007 | Collins et al. | |
| 7,294,563 B2 | 11/2007 | Al-Bayati et al. | |
| 7,303,982 B2 | 12/2007 | Collins et al. | |
| 7,320,734 B2 | 1/2008 | Collins et al. | |
| 7,393,765 B2 | 7/2008 | Hanawa et al. | |
| 7,430,984 B2 | 10/2008 | Hanawa et al. | |
| 7,465,478 B2 | 12/2008 | Collins et al. | |
| 7,479,456 B2 | 1/2009 | Buchberger, Jr. et al. | |
| 7,622,693 B2 | 11/2009 | Foret | |
| 7,642,180 B2 | 1/2010 | Al-Bayati et al. | |
| 7,665,407 B2 | 2/2010 | Hwang et al. | |
| 7,700,465 B2 | 4/2010 | Collins et al. | |
| 7,709,415 B2 | 5/2010 | Sugo et al. | |
| 7,743,730 B2 | 6/2010 | Kholodenko et al. | |
| 7,867,366 B1 | 1/2011 | McFarland et al. | |
| 7,951,749 B2 | 5/2011 | Yang et al. | |
| 8,002,992 B2 | 8/2011 | Foret | |
| 8,076,258 B1 | 12/2011 | Biberger | |
| 8,232,729 B2 | 7/2012 | Kitano et al. | |
| 8,263,178 B2 | 9/2012 | Boulos et al. | |
| 8,318,356 B2 | 11/2012 | Gadkaree et al. | |
| 8,324,523 B2 | 12/2012 | Foret | |
| 8,357,873 B2 | 1/2013 | Foret | |
| 8,361,404 B2 | 1/2013 | Gutsol et al. | |
| 8,366,925 B2 | 2/2013 | Foret | |
| 8,773,138 B2 | 7/2014 | Shinada et al. | |
| 8,784,764 B2 | 7/2014 | Gadkaree et al. | |
| 8,797,041 B2 | 8/2014 | Shinada et al. | |
| 8,829,913 B2 | 9/2014 | Shinada et al. | |
| 8,883,110 B2 | 11/2014 | Ueda | |
| 9,284,210 B2 | 3/2016 | Boughton | |
| 2003/0027054 A1 | 2/2003 | Ball et al. | |
| 2003/0047449 A1 | 3/2003 | Hanawa et al. | |
| 2003/0226641 A1 | 12/2003 | Collins et al. | |
| 2004/0012319 A1 | 1/2004 | Shun'ko | |
| 2004/0050098 A1 | 3/2004 | Ball et al. | |
| 2004/0107906 A1 | 6/2004 | Collins et al. | |
| 2004/0107907 A1 | 6/2004 | Collins et al. | |
| 2004/0107908 A1 | 6/2004 | Collins et al. | |
| 2004/0107909 A1 | 6/2004 | Collins et al. | |
| 2004/0112542 A1 | 6/2004 | Collins et al. | |
| 2004/0149217 A1 | 8/2004 | Collins et al. | |
| 2004/0149218 A1 | 8/2004 | Collins et al. | |
| 2004/0166612 A1 | 8/2004 | Maydan et al. | |
| 2004/0200417 A1 | 10/2004 | Hanawa et al. | |
| 2004/0238345 A1 | 12/2004 | Koulik et al. | |
| 2005/0016456 A1 | 1/2005 | Taguchi et al. | |
| 2005/0051271 A1 | 3/2005 | Collins et al. | |
| 2005/0051272 A1 | 3/2005 | Collins et al. | |
| 2005/0070073 A1 | 3/2005 | Al-Bayati et al. | |
| 2005/0136604 A1 | 6/2005 | Al-Bayati et al. | |
| 2005/0188728 A1 * | 9/2005 | Zhiou | C03B 37/02745 65/402 |
| 2005/0191827 A1 | 9/2005 | Collins et al. | |
| 2005/0191828 A1 | 9/2005 | Al-Bayati et al. | |
| 2005/0191830 A1 | 9/2005 | Collins et al. | |
| 2005/0223849 A1 * | 10/2005 | Ott | B22F 3/001 75/351 |
| 2005/0230047 A1 | 10/2005 | Collins et al. | |
| 2006/0043065 A1 | 3/2006 | Buchberger, Jr. et al. | |
| 2006/0073683 A1 | 4/2006 | Collins et al. | |
| 2006/0081558 A1 | 4/2006 | Collins et al. | |
| 2007/0042580 A1 | 2/2007 | Al-Bayati et al. | |
| 2007/0075051 A1 | 4/2007 | Morrisroe | |
| 2007/0119546 A1 | 5/2007 | Collins et al. | |
| 2007/0137573 A1 | 6/2007 | Kholodenko et al. | |
| 2007/0175241 A1 | 8/2007 | DeLamielleure et al. | |
| 2007/0212811 A1 | 9/2007 | Hanawa et al. | |
| 2007/0235419 A1 | 10/2007 | Kong et al. | |
| 2008/0038555 A1 * | 2/2008 | Sekine | B22F 9/002 428/402 |
| 2008/0044960 A1 | 2/2008 | Al-Bayati et al. | |
| 2008/0145553 A1 | 6/2008 | Boulos et al. | |
| 2008/0173641 A1 | 7/2008 | Hadidi et al. | |
| 2009/0064716 A1 | 3/2009 | Sakamoto et al. | |
| 2009/0149028 A1 | 6/2009 | Marakhtanov et al. | |
| 2009/0188898 A1 | 7/2009 | Kong et al. | |
| 2010/0044477 A1 | 2/2010 | Foret | |
| 2010/0074807 A1 | 3/2010 | Bulkin et al. | |
| 2010/0107700 A1 * | 5/2010 | Dawes | C03B 37/01282 65/404 |
| 2010/0199721 A1 | 8/2010 | Antoine et al. | |
| 2010/0218558 A1 | 9/2010 | Gross et al. | |
| 2011/0097901 A1 | 4/2011 | Banna et al. | |
| 2011/0133746 A1 | 6/2011 | Shinada et al. | |
| 2011/0140607 A1 | 6/2011 | Moore et al. | |
| 2011/0187379 A1 | 8/2011 | Shinada et al. | |
| 2011/0201492 A1 | 8/2011 | Yang et al. | |
| 2011/0260732 A1 | 10/2011 | Shinada et al. | |
| 2011/0298376 A1 | 12/2011 | Kanegae et al. | |
| 2011/0300029 A1 | 12/2011 | Foret | |
| 2011/0316551 A1 | 12/2011 | Shinada et al. | |
| 2011/0316552 A1 | 12/2011 | Shinada et al. | |
| 2012/0125052 A1 | 5/2012 | Dong et al. | |
| 2012/0187844 A1 | 7/2012 | Hoffman et al. | |
| 2012/0321527 A1 | 12/2012 | Gutsol et al. | |
| 2012/0321895 A1 | 12/2012 | Ueda | |
| 2013/0118589 A1 | 5/2013 | Hu et al. | |
| 2013/0126332 A1 | 5/2013 | Foret | |
| 2013/0126485 A1 | 5/2013 | Foret | |
| 2013/0175405 A1 | 7/2013 | Khozikov et al. | |
| 2013/0327097 A1 * | 12/2013 | Abe | C03B 37/025 65/435 |
| 2014/0000316 A1 | 1/2014 | Coggin, Jr. | |
| 2014/0291302 A1 | 10/2014 | Morrisroe | |
| 2014/0332506 A1 | 11/2014 | Morrisroe | |

(56) References Cited

U.S. PATENT DOCUMENTS

| | | |
|---|---|---|
| 2015/0274566 A1 | 10/2015 | Boughton |
| 2015/0274567 A1 | 10/2015 | Boughton |
| 2016/0029472 A1 | 1/2016 | Jevtic et al. |

FOREIGN PATENT DOCUMENTS

| | | |
|---|---|---|
| CN | 102522310 A | 6/2012 |
| CN | 202310265 U | 7/2012 |
| EP | 2256781 B1 | 6/1998 |
| EP | 1831425 B1 | 8/2005 |
| EP | 2424336 A1 | 8/2010 |
| FR | 2629573 A1 | 10/1989 |
| GB | 2196956 A | 11/1986 |
| IN | 200900450 P2 | 8/2009 |
| JP | 03064182 B2 | 5/2000 |
| JP | 2003212572 A | 7/2003 |
| JP | 2004124231 A | 4/2004 |
| JP | 2004225135 A | 8/2004 |
| JP | 2004338991 A | 12/2004 |
| JP | 2006244938 A | 9/2006 |
| JP | 2008202804 A | 9/2008 |
| JP | 04239145 B2 | 3/2009 |
| JP | 2013082591 A | 5/2013 |
| JP | 2013112540 A | 6/2013 |
| JP | 2013112571 A | 6/2013 |
| KR | 2003008166 A | 1/2003 |
| WO | 200139560 A1 | 5/2001 |
| WO | 2006078340 A2 | 7/2006 |
| WO | 2009043001 A1 | 4/2009 |
| WO | 2012026819 A1 | 3/2012 |
| WO | 2012043484 A1 | 4/2012 |
| WO | 2012103101 A1 | 8/2012 |
| WO | 201513173 A1 | 1/2015 |
| WO | 201550803 A1 | 4/2015 |

OTHER PUBLICATIONS

FR2629573A1 English Translation, Performed by USPTO Translations Service Center, Dec. 2015.*
Ahmadpour et al; "The Preparation of Active Carbons From Coal by Chemical and Physical Activation"; Carbon, vol. 34, No. 4, pp. 471-479; 1996.
Ahmadpour et al; "The Preparation of Activated Carbon From Macadamia Nutshell by Chemical Activation" Carbon, vol. 35, No. 12, pp. 1723-1732 1997.
Al-Shamma et al., "Design and Construction of a 2.45 GHz Waveguide-Based Microwave Plasma Jet at Atmospheric Pressure for Material Processing", Journal of Physics D: Applied Physics, 2001, vol. 34, pp. 2734-3741.
Boulos, "Plasma Power Can Make Better Powders", Metal Powder Report, May 2014, pp. 16-21.
Huang et al; "Low-Temperature Cyclonic Plasma Created At Atmospheric Pressure," Plasma Science, IEEE Transactions, vol. 37, No. 7, pp. 1169,1171, Jul. 2009.
Huang et al; "Contact Angle Analysis of Low-Temperature Cyclonic Atmospheric Pressure Plasma Modified Polyethylene Terephthalate," Thin Solid Films, vol. 518, Issue 13, pp. 3575-3580, 2010.
Illan-Gomez et al; "Acitvated Carbons From Spanish Coals. 2. Chemical Activation"; Energy and Fuels, 1996, 10, 1108-1114.
International Search Report and Written Opinion PCT/US2015/022891 dated Jun. 12, 2015.
International Search Report and Written Opinion PCT/US2015/022974 dated Jun. 23, 2015.
International Search Report and Written Opinion PCT/US2015/022982 dated Jun. 24, 2015.
Kadlec et al; "Structure of Pores of Active Carbons Prepared by Water-Vapour and Zinc-Dichloride Activation"; Carbon, 1970, vol. 8, pp. 321-331.
Kawaguchi et al; "Challenge to Improve Glass Melting and Fining Process"; Ceramics-Silikaty 52 (4) 217-224 (2008).
Kment et al; "Atmospheric Pressure Barrier Torch Discharge and Its Optimization for Flexible Deposition of TiO2 Thin Coatings on Various Surfaces," Surface and Coatings Technology, vol. 204, 2009, pp. 667-675.
Kurniawan et al.; "Atmospheric Pressure Glow Discharge Plasma Polymerization for Surface Treatment on Sized Basalt Fiber/Polylactic Acid Composites"; Composites: Part B 43 (2012) 1010-1014.
Laimer et al., "Characterization of an Atmospheric Pressure Radio-Frequency Capacitive Plasma Jet", Plasma Processes and Polymers, 2007, vol. 4, pp. S487-S492.
Laimer et al., "Investigation of an Atmospheric Pressure Radio-Frequency Capacitive Plasma Jet", Vacuum Surface Engineering Surface Instrumentation & Vacuum Technology, 2005, vol. 79, pp. 209-214.
Lie, et al., "Characteristics of Gliding Arc Discharge Plasma", Plasma Science & Technology, Nov. 2006, vol. 8, No. 6, pp. 653-655.
Lu et al; "On Atmospheric-Pressure Non-Equilibrium Plasma Jets and Plasma Bullets," Plasma Sources Science and Technology, vol. 21, No. 034005, 2012, pp. 1-17.
Nemec et al; "Glass Melting and Its Innovation Potentials: Bubble Removal Under the Effect of the Centrifugal Force"; Ceramics—Silikaty 52 (4) 225-239 (2008).
Pandolfo et al; "Carbon Properties and Their Role in Supercapacitors"; Journal of Power Sources 157 (2006) 11-27.
Park et al., "Discharge Phenomena of an Atmospheric Pressure Radio-Frequency Capacitice Plasma Source", Journal of Applied Physics, Jan. 1, 2001, vol. 89, No. 1, pp. 20-28.
Park et al., "Gas Breakdown in an Atmospheric Pressure Radio-Frequency Capacitive Plasma Source", Journal of Applied Physics, Jan. 1, 2001, vol. 89, No. 1, pp. 15-19.
Roth "Industrial Plasma Engineering: vol. 1: Principles," Philadelphia: Institute of Physics Publishing, 2003, pp. 167-170.
Roth, "Atmospheric Dielectric Barrier Discharges (DBDS)", Industrial Plasma Engineering, vol. 2, Copyright IOP Publishing Ltd 2001, Applications to Nonthermal Plasma Processing, pp. 50-65.
Roth, "Capacitive RF Electrical Discharges in Gases", Industrial Plasma Engineering, vol. 1, Copyright IOP Publishing Ltd 1995, Principles, pp. 440-461.
Roth, "Industrial Plasma Engineering: vol. 1: Principles," Philadelphia: Institute of Physics Publishing, 2003, p. 443.
Roth, et al., "The Physics and Phenomenology of One Atmosphere Uniform Glow Discharge Plasma (OAUGDPTM) Reactors for Surface Treatment Applications", Journal of Physics D: Applied Physics, 2005, vol. 38, pp. 555-567.
Sands et al;"A Streamer-Like Atmospheric Pressure Plasma Jet," Applied Physics Letters, vol. 92, Apr. 2008, pp. 151503-1-151503-3.
Seo, et al,; "Radio Frequency Thermal Plasma Treatment for Size Reduction and Spheroidization of Glass Powders Used in Ceramic Electronic Devices"; J. Am. Ceram. Soc., 90 (6) 1717-1722 (2007).
Teng et al; "Preparation of Porous Carbons From Phenol-Formaldehyde Resins With Chemical and Physical Activation"; Carbon 38 (2000) 817-824.
Tennison et al; "Phenolic-Resin-Derived Activated Carbons"; Applied Catalysis A: General 173 (1998) 289-311.
Truesch et al; "Basic Properties of Specific Wood-Based Materials Carbonised in a Nitrogen Atmosphere"; Wood Sci Technol (2004) 38, 323-333.
Wylie, et al., "An Atmospheric Microwave Plasma Jet for Ceramic Material Processing", Journal of Materials Processing Technology, 2004, vols. 153-154, pp. 288-293.
Yan et al; "Spheroidization of Silica Powders in a Radio Frequency Plasma"; Institute of Process Engineering, Chinese Acaday of Sciences; 5 pages.
Yao, et al., "An Innovative Energy-Saving In-Flight Melting Technology and Its Application to Glass Production", Science and Technology of Advanced Materials, 2008, vol. 9, pp. 1-8.
Yue et al; "Preparation of Fibrous Porous Materials by Chemical Activation 1. ZnCl2 Activation of Polymer-Coated Fibers"; Carbon 40 (2002) 1181-1191.

(56) References Cited

OTHER PUBLICATIONS

Yue et al; "Preparation of Fibrous Porous Materials by Chemical Activation 2. H3PO4 Activation of Polymer Coated Fibers"; Carbon 41 (2003) 1809-1817.
International Search Report and Written Opinion PCT/US2016/012557 dated Apr. 22, 2016.
Seo, et al., "Direct Synthesis of Nano-Sized Glass Powders With Spherical Shape by RF (Radio Frequency) Thermal Plasma", Thin Solid Films, 2011, vol. 519, pp. 7111-7115.
Cadek et al; "Bio-Based Materials for Supercapacitor"; SGL Group—The Carbon Company, Meitingen Germany; 3 Pages; Date Unknown.
Gupta et al; "Fluid Bed Technology in Materials Processing" Chapter 4; 80 pages; 1999.
Kurniawan et al., "Plasma Polymerization of Basalt Fiber/Polylactic Acid Composites: Effects on Mechanical Properties", 18th International Conference on Composite Materials, pp. 1-4; 2011.
Yan et al; "Spheroidization of Silica Powders in a Radio Frequency Plasma"; Institute of Process Engineering, Chinese Acaday of Sciences; 5 pages; 2006.

\* cited by examiner

METHODS AND APPARATUS FOR MATERIAL PROCESSING USING ATMOSPHERIC THERMAL PLASMA REACTOR

This application is a divisional of U.S. patent application Ser. No. 14/230,914 filed on Mar. 31, 2014, the content of which is relied upon and incorporated herein by reference in its entirety, and the benefit of priority under 35 U.S.C. § 120 is hereby claimed.

BACKGROUND

The present disclosure relates to methods and apparatus for material processing using a atmospheric thermal plasma reactor.

Glass substrates may be used in a variety of applications, including windows, high-performance display devices, and any number of other applications. The quality requirements for glass substrates have become more stringent as the demand for improved resolution, clarity, and performance increases. Glass quality may, however, be negatively impacted by various processing steps, from forming the glass melt to final packaging of the glass product.

One processing step that may result in reduced glass quality is the melting process, wherein the components of a glass batch material are mixed and heated in a melting apparatus. During this process, the components of the glass batch material melt and react, giving off reaction gases, which produce bubbles in the molten glass. Additionally, the melting process may produce an inhomogeneous glass melt having regions of differing chemical compositions. The first melt to form is often highly reactive with the refractory materials, which may lead to excessive wear of the apparatus and/or defects in the glass melt. Denser portions of the melt may also sink to the bottom of the melting apparatus, leading to a sludge layer, which has different optical properties than the rest of the melt and is difficult to completely mix back into the overall melt. The sludge layer therefore results in inhomogeneous portions of the melt, referred to in the art and herein as chord. Finally, due to typically large processing volumes, it is possible that various glass batch materials may not completely melt. Any un-melted or partially melted materials are carried through the melting process and may later become defects in the glass product.

Current melting processes for producing high quality optical glass utilize high temperatures and stirring to remove bubbles from the glass melt. However, such processes may be cost prohibitive, as they require expensive metals and specially designed high temperature refractory materials for the processing equipment. Further, these costly melting systems require a long processing time and high energy expenditure as the reaction gases have a long distance to travel to escape the glass melt and the sludge layer must be mixed from the bottom of the melter tank into the rest of the glass melt in the tank, requiring a mixing motion over a long distance through a highly viscous fluid.

Alternative methods for preventing glass bubbles and inhomogeneous portions in the glass melt include processing the melt in smaller batches. In this manner, the gas bubbles have a shorter distance to travel to escape the melt and the sludge layer can be more easily incorporated into the rest of the melt. However, as with many small scale processes, these methods have various drawbacks such as increased processing time and expense.

Accordingly, there are needs in the art for techniques to improve the melting processes of glass batch material for producing high quality optical glass.

SUMMARY

The present disclosure relates to an area of material processing (for example, glass batch material) by means of atmospheric thermal plasma in which the material to be processed is dispensed as material feedstock (containing partially sintered material particles) into a plasma plume that is of a generally cylindrical configuration. For commercial purposes, it is important that the atmospheric thermal plasma process exhibits high throughput and sufficient thermal energy to achieve the desired thermal reaction.

Inductively coupled plasma (ICP) systems have been used for low pressure sputtering and etching systems on substrates. Inductively coupled atmospheric plasma material processing systems are generally constructed with small diameter coils or microwave waveguides which limit the plasma to a small volumetric column (typically about 5 mm in diameter). Even if such a system employs a relatively high power RF source (e.g., about 400 kW), at a very high equipment cost, only a low rate (e.g., 20-40 kg per hour) of particulate material may be processed through the plasma. In the glass batch processing context, practical production rates are at least one metric ton per day, which would barely be met using the conventional ICP system at peak production twenty four hours a day. In order to address the shortcomings of the processing rate, multiples of the equipment set up, energy, and maintenance costs would be required.

Another problem with the conventional ICP system is a limit on the permissible input particle sizes, typically about 90 um or less. The free fall characteristics of such small particles in the ICP plasma system are such that sufficient heating of the particles may be achieved within a period of about 300 ms or less. If the particles were larger, and did not absorb enough heat to melt, then the once through-processed particles would have to be recycled through the system again, thereby reducing the throughput rate even further.

One or more embodiments disclosed herein provide a new material feed capability in a plasma containment vessel to thermally process the material. In the context of glass batch material processing, the compounds of the glass batch material are mixed to provide a homogeneous distribution of the compounds. Then the glass batch material is pressed and partially sintered to hold its shape as a feedstock, such as a generally cylindrical rod form. The feedstock is continuously inserted into a plasma containment vessel and the feedstock is rotated within the center of a plasma plume within the plasma containment vessel. Notably, this new approach for material introduction avoids at least some of the issues with conventional plasma processing because there is no need to introduce separate granulated powder into the plasma plume. As a distal end of the feedstock absorbs energy from the plasma plume, the feedstock melts and droplets of molten material (in this example glass material) are formed into spheres and flung from the feedstock due to centrifugal forces. The reactive gases boil off of the respective spheres of material. The liquid spheres are then rapidly quenched and collected or fed into a next processing stage (e.g., a pre-melter or the like). The size distribution of the droplets is determined by the rotational speed of the feedstock within the thermal environment of the plasma plume.

The embodiments disclosed herein overcome the low particulate material processing rates of existing systems in order to provide industrial scale applications. The embodiments provide high volumes of plasma at atmospheric pressures, and produce adequate kinetic energy within the plasma plume to heat the material and achieve desired reactions, including melting and/or other thermally-based processes.

Other aspects, features, and advantages will be apparent to one skilled in the art from the description herein taken in conjunction with the accompanying drawings.

DESCRIPTION OF THE DRAWINGS

For the purposes of illustration, there are forms shown in the drawings that are presently preferred, it being understood, however, that the embodiments disclosed and described herein are not limited to the precise arrangements and instrumentalities shown.

DETAILED DESCRIPTION OF THE PREFERRED EMBODIMENTS

Figure 1:
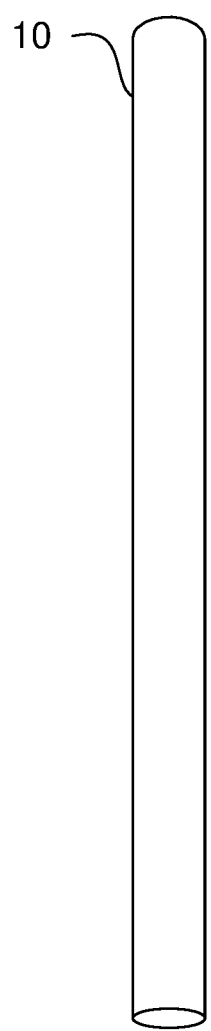
FIG. 1 is a schematic illustration of a length of feedstock material, such as glass batch material, according to one or more embodiments of the present disclosure.

With reference to the drawings wherein like numerals indicate like elements there is shown in FIG. 1 a feedstock material 10 produced in order to be thermally treated within a plasma thermal source. The feedstock material 10 may be composed of any suitable material, for example glass batch material. Although particular embodiments herein may be presented in the context of thermally treating glass batch material, the embodiments herein are not limited to glass batch material.

The feedstock material 10 denotes a mixture of precursor compounds and/or particles which, upon melting, reacting and/or other action, combine to form a particular, desired material. In the case of glass batch material, the precursor compounds may include silica, alumina, and various additional oxides, such as boron, magnesium, calcium, sodium, strontium, tin, or titanium oxides. For instance, the glass batch material may be a mixture of silica and/or alumina with one or more additional oxides. One skilled in the art will appreciate that glass batch material may take on a wide variety of specific combinations of compounds and substances.

Figure 2:
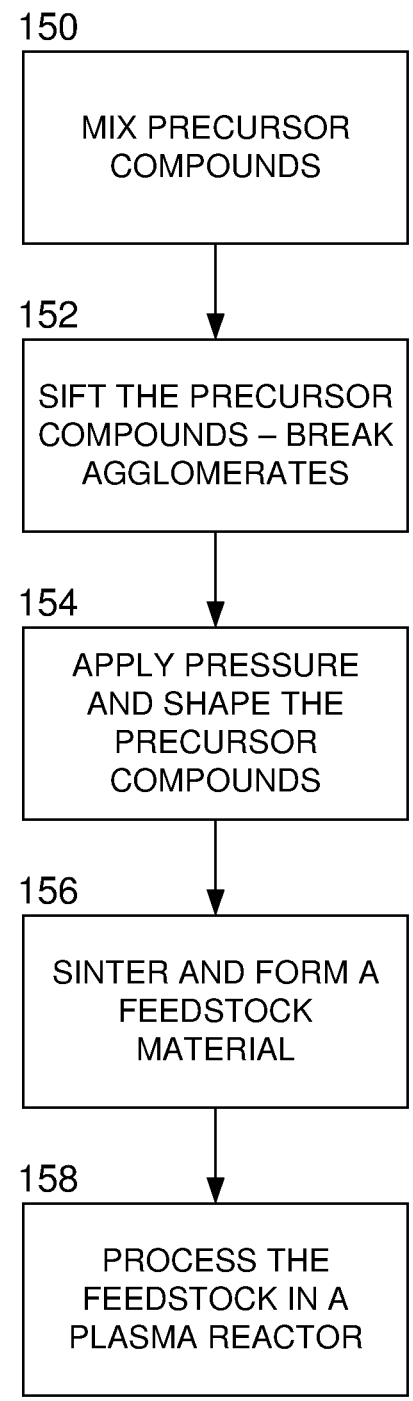
FIG. 2 is flow diagram illustrating processing steps for producing the feedstock material of FIG. 1 according to one or more embodiments of the present disclosure.
Figure 3:
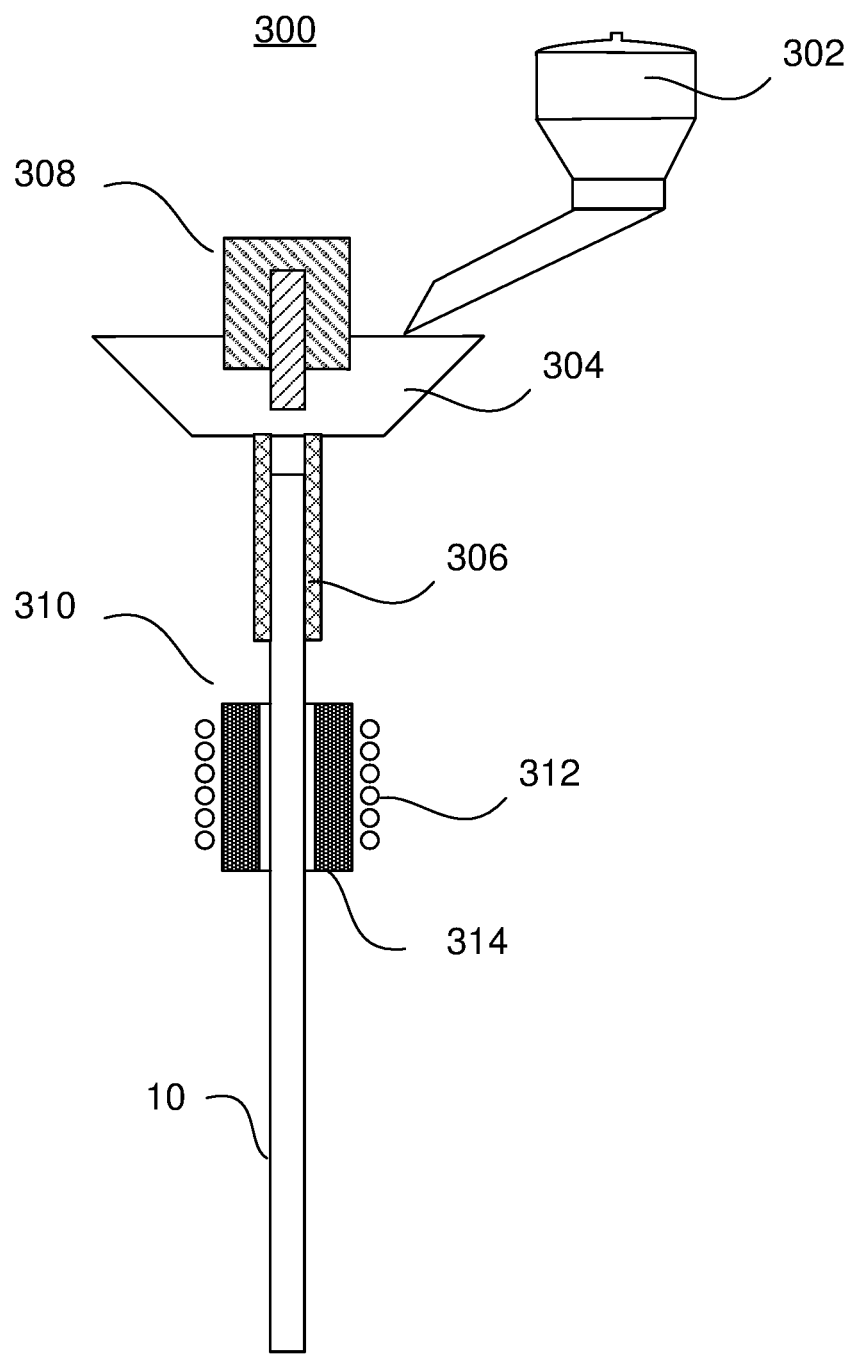
FIG. 3 is a side, schematic illustration of one or more embodiments of an apparatus for carrying out a process for producing the feedstock material of FIG. 1 according to one or more embodiments of the present disclosure.

With reference to FIGS. 1-3, the feedstock material 10 contains a plurality of precursor compounds that have been mixed, formed into an elongate shape, and at least partially sintered. FIG. 2 is a flow diagram illustrating processing steps for producing the feedstock material 10 and FIG. 3 is a side, schematic illustration of one or more embodiments of a feedstock processing mechanism 300 for carrying out a process for producing an extruded source of the feedstock material 10. At step 150 of the process flow, the plurality of precursor compounds are mixed. By way of example, the precursor compounds may be directed to producing glass and contain one or more of: $SiO_2$, $Al_2O_3$, $B_2O_3$, MgO, $CaCO_3$, $SrCO_3$, $SnO_2$ and/or various mixtures thereof. The precursor compounds may be mixed in a batch feeder, mixer, and/or batch sifter 302, where the precursor compounds are thoroughly mixed and any agglomerates are broken up (step 152).

The mixed precursor compounds may be fed into a powder tray 304, which funnels the mixed precursor compounds into a rotating powder die 306. A powder ram 308 operates in conjunction with the powder die 306 in order to apply pressure to the mixed precursor compounds and to shape the mixed precursor compounds into an elongate shape (step 154). A compression force of compaction may be from about 20 psi to 200 psi.

The pressed precursor compounds are next heated in order to at least partially sinter the precursor compounds into the feedstock material 10 (step 156). By way of example, the feedstock processing mechanism 300 may include an inductive heating mechanism 310 comprising a coil 312 about a central axis. The coil 312 may be wound about a graphite suscepter 314 through which the pressed precursor compounds pass. Activation of the coil 312 causes the graphite suscepter 314 to heat up, which in turn heats the pressed precursor compounds as such material passes through the graphite suscepter 314 (and the coil 312) along the central axis thereof. The heating is controlled in order to achieve at least partial sintering of the pressed precursor compounds. For example, an inductive heating mechanism 310 may operate to heat the pressed precursor compounds to between about 500-1000° C. This may be achieved by applying an AC power source to the coil 312 of sufficient magnitude, such as from about 10 kW to 500 kW (depending on the desired material throughput). A frequency of the AC power provided to the inductive heating mechanism 310 (i.e., to the coil 312) may range from about 50 kHz to 500 kHz.

The parameters of the mixing, sifting, pressing, and/or heating may be adjusted in order to attain a feedstock material 10 of desired diameter, mechanical strength, and/or thermal reactivity. For example, the feedstock processing mechanism 300 may be adjusted to produce a feedstock material 10 having a diameter of one of: (i) between about 5 mm-50 mm; (ii) between about 10 mm-40 mm; and (iii) between about 20 mm-30 mm.

The extruded feedstock material 10 may be produced beforehand and stored for later use in a plasma reactor (step 158), or the feedstock processing mechanism 300 may be integrated with the plasma reactor such that the extruded feedstock 10 may be fed in a continuous process into the plasma reactor.

Figure 4:
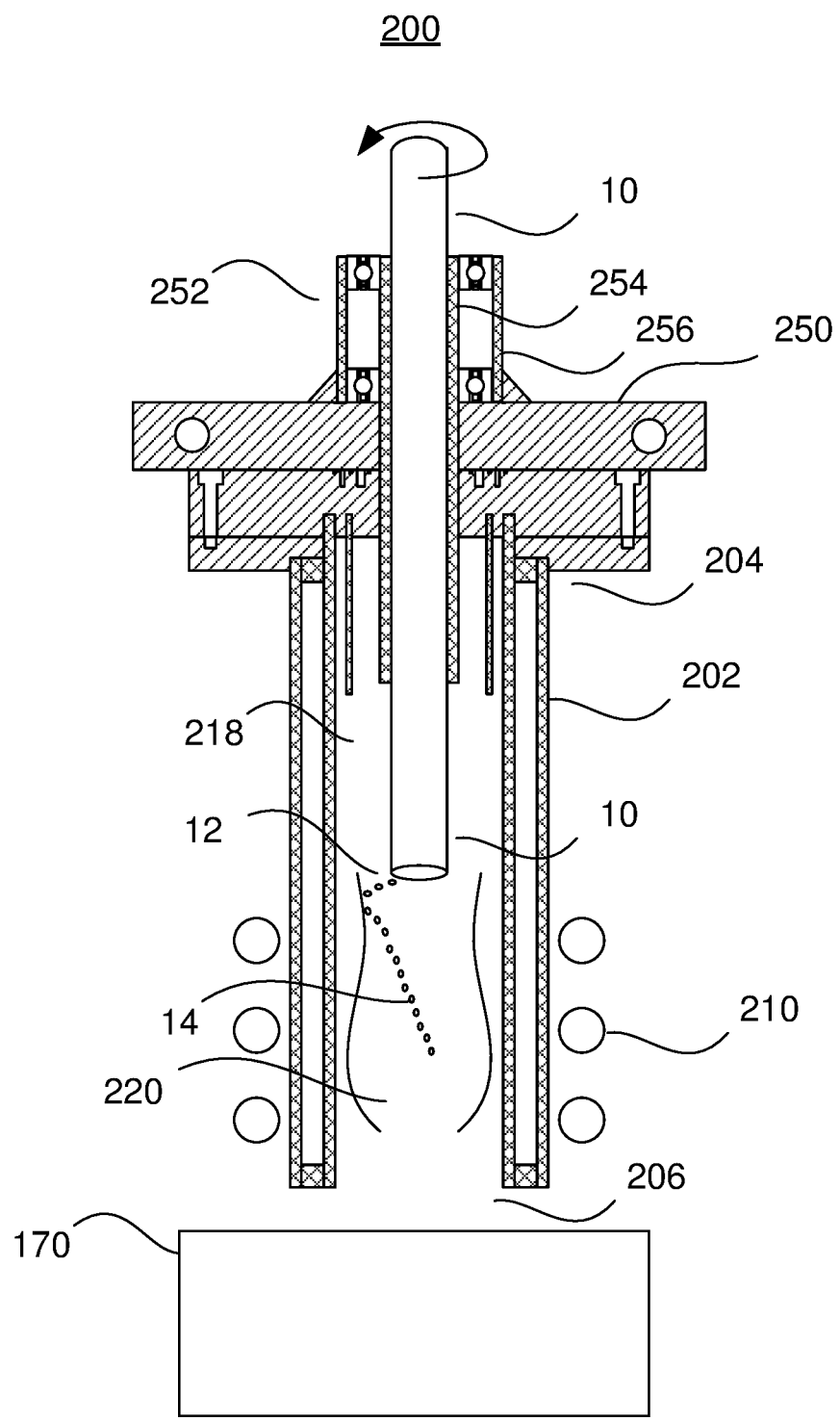
FIG. 4 is a side, schematic illustration of one or more embodiments of a plasma containment vessel usable for thermally processing the feedstock material of FIG. 1 and/or other embodiments.

Reference is now made to FIG. 4, which is a side, schematic illustration of one or more embodiments of a plasma containment vessel 200 usable for thermally processing the feedstock material 10 of FIGS. 1-3 and/or other embodiments. The plasma containment vessel 200 includes at least one wall member 202 defining an inner volume 218 having a central axis, an inlet end 204, and an opposing outlet end 206. The at least one wall member 202 may be formed from a suitable non-conductive, non-corrosive, high temperature, dielectric material, such as high temperature ceramic materials, quartz, preferably with an ultra-low coefficient of thermal expansion. In order to permit cooling of one or more components of the plasma containment vessel 200, the wall member 202 may include one or more internal channels operating to carry cooling fluid therethrough. In this regard, the internal channels may be accessed via respective inlet/outlets that are in fluid communication with the one or more sources of cooling fluid (not shown).

The plasma containment vessel 200 may include a mechanism configured to receive a source of RF power (not shown) having characteristics sufficient to produce an electromagnetic field within the plasma containment vessel 200 for maintaining a plasma plume 220 from a source of plasma gas (not shown). For example, the mechanism may include an induction coil 210 disposed about the central axis of the plasma containment vessel 200, and the coil 210 may be operable to receive the source of RF power and produce the electromagnetic field. By way of example, the RF power may be of a characteristic such that the electromagnetic field exhibits a frequency of at least one of: (i) at least 1 MHz, (ii) at least 3 MHz, (iii) at least 4 MHz, (iv) at least 5 MHz, (v) at least 10 MHz, (vi) at least 15 MHz, (vii) at least 20 MHz, (viii) at least 30 MHz, (ix) at least 40 MHz, and (x) between about 1 to 50 MHz. The RF power may be at a power level from about 5 kW to 1 MW (or other suitable power level).

A material inlet 250 may be disposed at the inlet end 204 of the plasma containment vessel 200, where the material inlet 250 may operate to receive the elongate feedstock material 10. Thus, the feedstock material 10 is introduced into the plasma containment vessel 200, where a distal end 12 of the feedstock 10 encounters the plasma plume 220. The plasma plume 220 is of sufficient thermal energy to cause at least a thermal reaction of the feedstock material 10. In particular, the plasma plume 220 may be of a substantially cylindrical shape, and may be of sufficient thermal energy, to cause the distal end 12 of the feedstock material 10 to melt, thereby producing respective substantially spherical droplets 14.

By way of example, the plasma containment vessel 200 may further include a rotation assembly 252 disposed in communication with the material inlet 250 and operating to permit the feedstock material 10 to spin about the longitudinal axis as the distal end 12 of the feedstock material 10 advances into the plasma plume 220. The rotation assembly 252 may be operable to spin the feedstock material 10 about the longitudinal axis at a sufficient speed to cause the melt to separate from the distal end 12 of the feedstock material 10, in response to centrifugal force, and to form the substantially spherical droplets 14. The rotational assembly 252 may include a feed tube 254 in coaxial orientation with a bearing assembly 256 (such as a ball bearing arrangement), which permits the feedstock material 10 to be guided within, and rotated by, the feed tube 254.

A controller (such a microprocessor controlled mechanism, not shown) may operate to control the rotation assembly 252 in order to vary a rate at which the feedstock material 10 spins, thereby controlling a size of the droplets 14. BY way of example, the rotation assembly 252 may spin the feedstock material 10 at a rate of one of: (i) between about 500 rpm-50,000 rpm; (ii) between about 1000 rpm-40,000 rpm; (iii) between about 1400 rpm-30,000 rpm; (iv) between about 2000 rpm-20,000 rpm; and (v) between about 5000 rpm-10,000 rpm. These spin rates may produce droplets having a size of one of: (i) between about 10 um-5000 um; (ii) between about 50 um-2000 um; (iii) between about 100 um-1000 um; (iv) between about 50 um-200 um; and (v) about 100 um.

It is noted that the size of the droplets 14 may also be affected by a temperature of the plasma plume 220. In accordance with one or more embodiments, a controller (not shown) may operate to control a power level of the RF power, thereby controlling an intensity of the electromagnetic field within the plasma containment vessel 200 and a temperature of the plasma plume 220. By way of example, the plasma plume may have a temperature ranging from one of: (i) about 9,000 K to about 18,000 K; (ii) about 11,000 K to about 15,000 K; and (iii) at least about 11,000 K.

The plasma plume is preferably of sufficient thermal energy to cause the droplets 14 from the feedstock material to thermally react. Examples of the types of thermal reactions contemplated herein include, at least one of: (i) at least partially melting the droplets 14 of material, (ii) at least partially melting at least one of the droplets 14 of material and one or more further materials thereby forming coated material particles, and (iii) at least partially melting the droplets 14 of material to form substantially homogeneous, spheroid-shaped intermediate particles.

Those skilled in the art will appreciate that the types of thermal reactions (and/or other reactions) within the plasma containment vessel 200 may include any number of additional reactions as would be evident from the state of the art. By way of example, the feedstock material may be at least partially melted with a further material that comprises silver, copper, tin, silicon or another semiconductor material, including the respective metal or metal oxide, etc. to form coated glass batch material particles. Glass particles coated with silver or copper, for instance, may have antibacterial properties, and glass particles coated with tin oxide may be photoactive.

The thermally reacted material is accumulated in a collection vessel 170. After collection, the thermally reacted material may be subjected to additional and/or optional processing steps.

The conventional approaches to prepare batch material, for example to make glass via a plasma process, requires special steps in order to reduce or eliminate fining and stirring. These steps may include a mixing step and a spray-drying step for a binding operation to produce agglomerates of the appropriate size to allow plasma energy absorption as the particles drop through the plasma. In accordance with the embodiments herein, however, such preparation and particle selection is not necessary since the precursor compounds are mixed to provide even distribution of the compounds throughout the batch, and the precursor compounds are pressed and partially sintered into a rod to be fed into the plasma plume. This mechanism permits a continuous feed process at a higher throughput without the aforementioned, complex preparation procedure. Therefore, specific selection of particle sizes (e.g., <90 um) are not required for plasma processing. Further, spray-drying for binding and producing agglomerates are not required for plasma processing. Still further, multiple recycling of material for additional plasma processing is not required. Indeed, high material throughput is achieved since the compacted rod of batch material with high bulk density is processed (as opposed to isolated individual particles), where the droplet production rate is significantly higher than in conventional plasma systems processing powder. The embodiments herein also provide reactive gas dissipation before glass particles are placed in a pre-melter, which reduces the need for fining. In addition, homogenization of the precursor compounds in the extrusion yields a uniform glass density in the glass particles prior to inclusion in the premelter reducing the need for stirring.

Although the disclosure herein has been described with reference to particular embodiments, it is to be understood that these embodiments are merely illustrative of the principles and applications of the embodiments herein. It is therefore to be understood that numerous modifications may be made to the illustrative embodiments and that other arrangements may be devised without departing from the spirit and scope of the present application.

The invention claimed is:

1. A method, comprising:
producing a plasma plume within a plasma containment vessel from a source of plasma gas;
substantially continuously mixing, pressing, and at least partially sintering precursor compounds into an elongate feedstock material and feeding the elongate feedstock material having a longitudinal axis into the plasma containment vessel such that at least a distal end of the feedstock material is heated within the plasma plume; and
spinning the feedstock material about the longitudinal axis as the distal end of the feedstock material advances into the plasma plume,
wherein the feedstock material is a mixture of compounds that have been mixed, formed into an elongate shape, and at least partially sintered.

2. The method of claim 1, wherein the plasma plume is of a substantially cylindrical shape, and is of sufficient thermal energy to cause the distal end of the feedstock material to melt.

3. The method of claim 2, wherein the step of spinning the feedstock material about the longitudinal axis includes spinning at a sufficient speed to cause the melt to separate from the distal end of the feedstock material, in response to centrifugal force, and to form respective substantially spherical droplets.

4. The method of claim 3, further comprising controlling a rate at which the feedstock material spins, thereby controlling a size of the droplets.

5. The method of claim 3, wherein the size of the droplets is one of: (i) between about 10 um-5000 um; (ii) between about 50 um-2000 um; (iii) between about 100 um -1000 um; (iv) between about 50 um-200 um; or (v) about 100 um.

6. The method of claim 3, further comprising controlling a temperature of the plasma plume thereby controlling a size of the droplets.

7. The method of claim 6, wherein the plasma plume has a temperature ranging from one of: (i) about 9,000 K to about 18,000 K; (ii) about 11,000 K to about 15,000 K; or (iii) at least about 11,000 K.

8. The method of claim 3, wherein the plasma plume is of sufficient thermal energy to cause the droplets from the feedstock material to thermally react.

9. The method of claim 8, wherein at least one of:
the thermal reaction includes at least partially melting the droplets,
the thermal reaction includes at least partially melting at least one of the droplets and one or more further materials thereby forming coated droplets of material, and
the thermal reaction includes at least partially melting the droplets to form substantially homogeneous, spheroid-shaped intermediate particles.

10. The method of claim 1, wherein the feedstock material is a glass batch material.

11. The method of claim 1, wherein the rate of spinning the feedstock material is one of: (i) between about 500 rpm-50,000 rpm; (ii) between about 1000 rpm-40,000 rpm; (iii) between about 1400 rpm-30,000 rpm; (iv) between about 2000 rpm-20,000 rpm; or (v) between about 5000 rpm-10,000 rpm.

12. The method of claim 1, wherein the pressing step includes pressing the mixed precursor compounds to between about 20 psi-200 psi.

13. The method of claim 1, wherein the heating step includes heating the pressed precursor compounds to between about 500-1000° C.

14. The method of claim 1, wherein the feedstock has a diameter of one of: (i) between about 5 mm-50 mm; (ii) between about 10 mm-40 mm; or (iii) between about 20 mm-30 mm.

15. A method, comprising:
producing a plasma plume within a plasma containment vessel from a source of plasma gas;
feeding an elongate feedstock material having a longitudinal axis into the plasma containment vessel such that at least a distal end of the feedstock material melts within the plasma plume;
spinning the feedstock material about the longitudinal axis at a sufficient speed as the distal end of the feedstock material advances into the plasma plume to cause the melt to separate from the distal end of the feedstock material, in response to centrifugal force, and to form respective substantially spherical droplets; and
introducing one or more further materials into the plasma containment vessel such that a thermal reaction occurs within the plasma plume to at least partially melt at least one of the substantially spherical droplets and the one or more further materials thereby forming coated droplets of material, wherein the feedstock material is a glass batch material.

16. The method of claim 15, further comprising controlling a rate at which the feedstock material spins, thereby controlling a size of the substantially spherical droplets.

17. The method of claim 16, wherein the size of the substantially spherical droplets is one of: (i) between about 10 um-5000 um; (ii) between about 50 um-2000 um; (iii) between about 100 um-1000 um; (iv) between about 50 um-200 um; or (v) about 100 um.

18. The method of claim 15, wherein the rate of spinning the feedstock material is one of: (i) between about 500 rpm-50,000 rpm; (ii) between about 1000 rpm-40,000 rpm; (iii) between about 1400 rpm-30,000 rpm; (iv) between about 2000 rpm-20,000 rpm; or (v) between about 5000 rpm-10,000 rpm.

* * * * *

UNITED STATES PATENT AND TRADEMARK OFFICE
CERTIFICATE OF CORRECTION

PATENT NO. : 9,908,804 B2
APPLICATION NO. : 15/235715
DATED : March 6, 2018
INVENTOR(S) : Daniel Robert Boughton Page 1 of 1

It is certified that error appears in the above-identified patent and that said Letters Patent is hereby corrected as shown below:

On the Title Page

On page 3, Column 1, item (56), other publications, Line 22, delete ""Acitvated" and insert -- "Activated --, therefor.

On page 3, Column 2, item (56), other publications, Line 28, delete "Capacitice" and insert -- Capacitive --, therefor.

On page 3, Column 2, item (56), other publications, Line 65, delete "Acaday" and insert -- Academy --, therefor.

On page 4, Column 1, item (56), other publications, Line 18, delete "Acaday" and insert -- Academy --, therefor.

In the Claims

In Column 7, Line 33, Claim 5, delete "100 um -1000" and insert -- 100 um-1000 --, therefor.

Signed and Sealed this
Fifth Day of May, 2020

Andrei Iancu
*Director of the United States Patent and Trademark Office*